United States Patent
Escamilla et al.

(10) Patent No.: US 12,238,884 B2
(45) Date of Patent: Feb. 25, 2025

(54) OVER-CENTER LATCH FOR MECHANICALLY AND ELECTRICALLY COUPLING INFORMATION HANDLING RESOURCE TO CIRCUIT BOARD

(71) Applicant: Dell Products L.P., Round Rock, TX (US)

(72) Inventors: Eduardo Escamilla, Round Rock, TX (US); Corey D. Hartman, Hutto, TX (US); Gilberto Hernandez, Pharr, TX (US)

(73) Assignee: Dell Products L.P., Round Rock, TX (US)

( * ) Notice: Subject to any disclaimer, the term of this patent is extended or adjusted under 35 U.S.C. 154(b) by 275 days.

(21) Appl. No.: 18/168,693

(22) Filed: Feb. 14, 2023

(65) Prior Publication Data

US 2024/0276664 A1    Aug. 15, 2024

(51) Int. Cl.
*H05K 7/14* (2006.01)
*G06F 1/18* (2006.01)
*H05K 5/02* (2006.01)

(52) U.S. Cl.
CPC .......... *H05K 7/1402* (2013.01); *G06F 1/184* (2013.01); *H05K 5/0221* (2013.01); *H05K 7/1409* (2013.01); *H05K 7/1418* (2013.01); *H05K 7/1461* (2013.01)

(58) Field of Classification Search
CPC .... H05K 7/402; H05K 7/1409; H05K 7/1418; H05K 7/1461; H05K 5/0221; G06F 1/184
USPC ........................................................ 361/801
See application file for complete search history.

(56) References Cited

U.S. PATENT DOCUMENTS

| | | | |
|---|---|---|---|
| 4,840,570 A * | 6/1989 | Mann, Jr. ............ | H05K 7/1461 439/372 |
| 10,955,881 B2 * | 3/2021 | Gopalakrishna .... | H01L 23/4093 |
| 11,570,924 B2 * | 1/2023 | Lyons .................. | G06F 3/0658 |
| 11,877,414 B2 * | 1/2024 | Gill ...................... | H01R 12/721 |
| 2008/0259582 A1 * | 10/2008 | Cheng .................... | G06F 1/185 361/801 |
| 2015/0022981 A1 * | 1/2015 | Tan ....................... | H04M 1/026 361/756 |

* cited by examiner

*Primary Examiner* — Zhengfu J Feng
(74) *Attorney, Agent, or Firm* — Jackson Walker L.L.P.

(57) ABSTRACT

A latch assembly may include a support, a handle for rotatably coupling to one of the support and the housing via a first axis and rotatable between unlatched and latched positions relative to the support, and a catch arm rotatably coupled to the handle via a second axis and arranged such that as the handle is rotated from the unlatched to an intermediate position between the unlatched and latched positions, the catch arm is translated in an arc from a first position in which it is disengaged from a post to a second position in which a retention feature of the catch arm positions itself under and proximate to a ledge of the post, and as the handle is rotated from the intermediate to the latched position, the catch arm and the retention feature move in a linear direction from the second to a third position.

14 Claims, 7 Drawing Sheets

OVER-CENTER LATCH FOR MECHANICALLY AND ELECTRICALLY COUPLING INFORMATION HANDLING RESOURCE TO CIRCUIT BOARD

TECHNICAL FIELD

The present disclosure relates in general to information handling systems, and more particularly to systems and methods for providing an over-center latch for mechanically and electrically coupling an information handling resource (e.g., a riser card) to a circuit board (e.g., motherboard).

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize one or more riser cards. A riser card is a printed circuit board that gives a motherboard of the information handling system the option for additional expansion cards to be added to the information handling system. Thus, a riser card is usually coupled to a motherboard receptacle connector via an edge connector, and may include one or more receptacle connectors mounted on the riser card to receive expansion cards in order to electrically couple such expansion cards to the motherboard. Accordingly, in general, the main purpose of a riser card may be to change the orientation of the expansion cards such that they fit a limited space within casing.

In order to provide mechanical structure for the riser card, its connectors, and expansion cards coupled to the riser card, a riser mechanical assembly may be used to house the riser card, its connectors, and expansion cards coupled to the riser card, and may also include mechanical features to mechanically retain the edge connector of the riser card within the receptacle connector of the motherboard.

In order to maintain functionality, the position of the edge connector of the riser card must remain within a certain window of connector tolerance or "wipe" to the receptacle connector of the motherboard. As connector speeds increase with successive generations, the total allowable wipe decreases, as longer wipes result in poorer signal integrity. Existing passive latching approaches to mechanically retaining the connectors are unable to ensure a full connector mate position, as such approaches require that some gap be present between a hook of a latch of the riser assembly and a ledge of a hook of a post extending from the motherboard to ensure that the latch hook freely engages with the post hook. This gap may leave the potential for a partial unseating during assembly or during a shock event. In addition, such gap may become equivalent to or a substantial part of an allowable wipe in the future as connector speeds increase.

SUMMARY

In accordance with the teachings of the present disclosure, the disadvantages and problems associated with existing approaches to mechanical and electrical coupling between an information handling resource and a circuit board 5 may be reduced or eliminated.

In accordance with embodiments of the present disclosure, an information handling system may include a circuit board having a receptacle connector mounted to a surface of the circuit board and having a post mounted to the surface of the circuit board and an information handling resource assembly comprising a housing for carrying an information handling resource having an edge connector configured to mechanically and electrically couple to the receptacle connector and a latch assembly. The latch assembly may include a support fixedly coupled to the housing, a handle rotatably coupled to one of the support and the housing via a first axis and rotatable between an unlatched position and a latched position relative to the support, and a catch arm rotatably coupled to the handle via a second axis. The catch arm may be arranged such that as the handle is rotated from the unlatched position to an intermediate position between the unlatched position and the latched position, the catch arm is translated in an arc from a first position in which it is disengaged from the post to a second position in which a retention feature of the catch arm positions itself under and proximate to a ledge of the post, and as the handle is rotated from the intermediate position to the latched position, the catch arm and the retention feature move in a direction away from and perpendicular to the surface of the motherboard to a third position in order to secure the retention feature to the ledge and drive a mechanical force to mate the receptacle connector and the edge connector.

In accordance with these and other embodiments of the present disclosure, a latch assembly may include a support configured to fixedly couple to a housing of an information handling resource, a handle configured to rotatably couple to one of the support and the housing via a first axis and rotatable between an unlatched position and a latched position relative to the support, and a catch arm rotatably coupled to the handle via a second axis and arranged such that as the handle is rotated from the unlatched position to an intermediate position between the unlatched position and the latched position, the catch arm is translated in an arc from a first position in which it is disengaged from a post to a second position in which a retention feature of the catch arm positions itself under and proximate to a ledge of the post, and as the handle is rotated from the intermediate position to the latched position, the catch arm and the retention feature move in a linear direction from the second position to a third position.

In accordance with these and other embodiments of the present disclosure, a method may include fixedly coupling a support of a latch assembly to a housing of an information handling resource, rotatably coupling a handle to one of the support and the housing via a first axis, rotatable between an unlatched position and a latched position relative to the support, and rotatably coupling a catch arm to the handle via a second axis and arranging the catch arm such that as the handle is rotated from the unlatched position to an intermediate position between the unlatched position and the latched position, the catch arm is translated in an arc from a first position in which it is disengaged from a post to a second position in which a retention feature of the catch arm positions itself under and proximate to a ledge of the post, and as the handle is rotated from the intermediate position to the latched position, the catch arm and the retention feature move in a linear direction from the second position to a third position.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
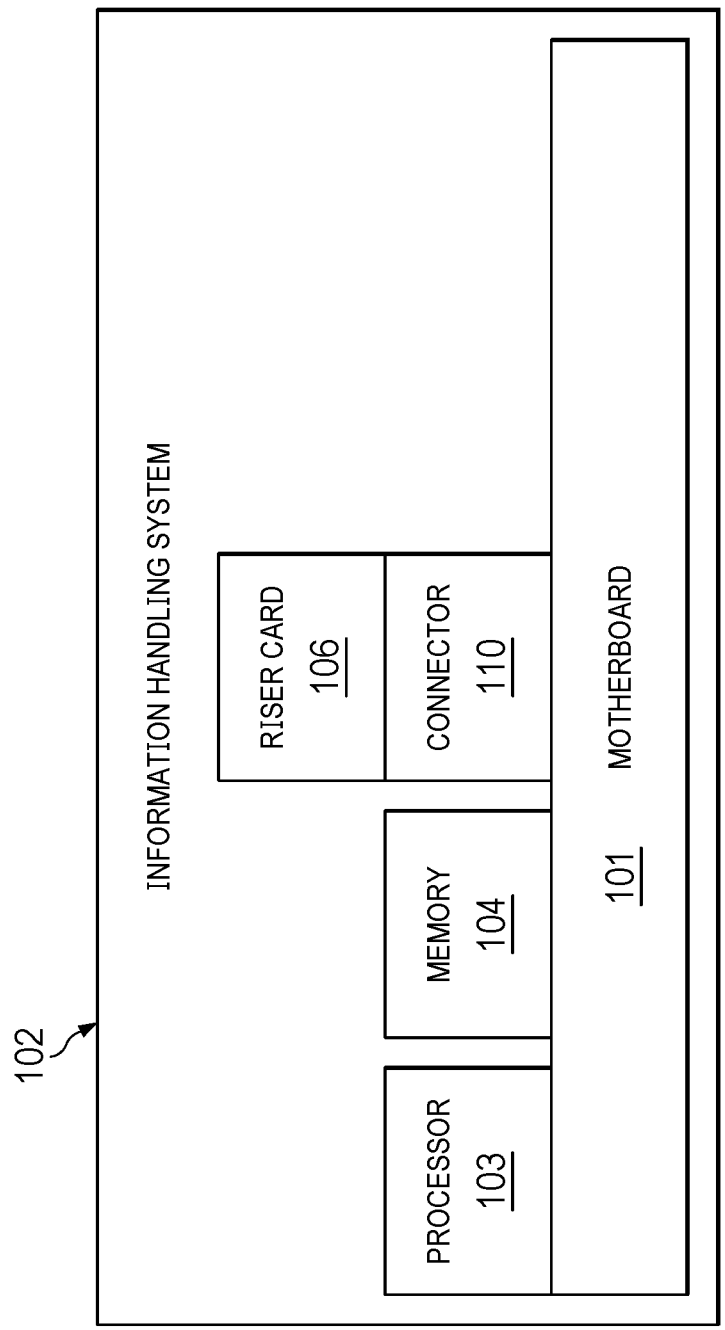
FIG. 1 illustrates a block diagram of selected components of an example information handling system, in accordance with embodiments of the present disclosure.

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a memory 104 coupled to motherboard 101, a connector 110 mechanically and electrically coupled to motherboard 101, and a riser card 106 electrically coupled to motherboard 101 via connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

Connector 110 may comprise any system, device, or apparatus fixedly mounted on motherboard 101 and may be constructed to mechanically couple a corresponding riser card 106 to motherboard 101 and to electrically couple such riser card 106 to motherboard 101, processor 103, and/or other components of information handling system 102. Connector 110 may comprise a socket including a receptacle slot or other opening configured to removably receive a corresponding mating edge connector of riser card 106.

Riser card 106 may comprise a circuit board enabling the option for additional expansion cards to be coupled to motherboard 101. Riser card 106 may be coupled to connector 110 via an edge connector (not explicitly shown in FIG. 1), and may include one or more receptacle connectors mounted (not explicitly shown in FIG. 1) on riser card 106 to receive expansion cards in order to electrically couple such expansion cards to motherboard 101.

In addition to motherboard 101, processor 103, memory 104, riser card 106, and connector 110, information handling system 102 may include one or more other information handling resources.

Figure 2A:
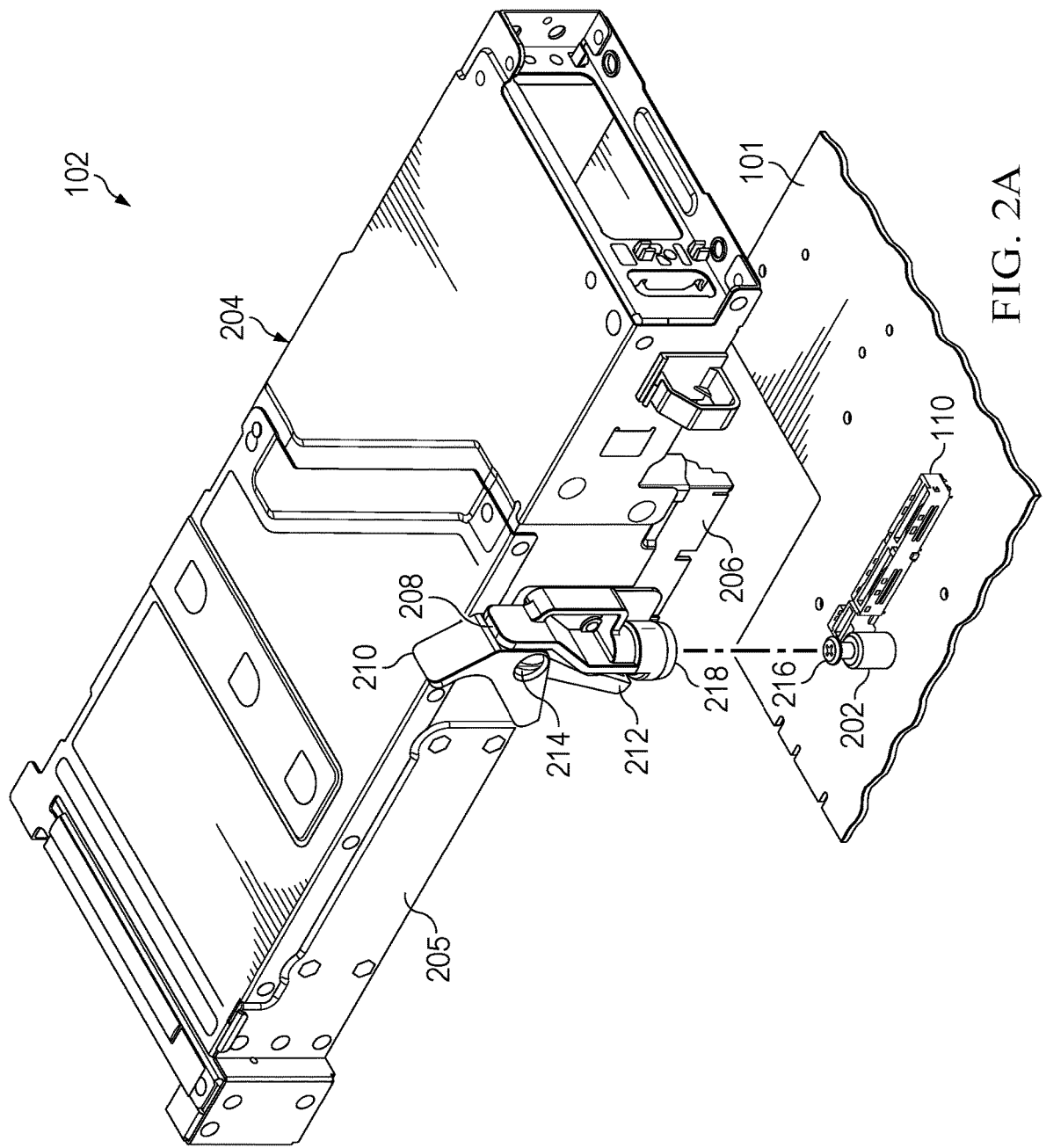
FIGS. 2A and 2B illustrate a perspective view of selected components of the example information handling system of FIG. 1, in accordance with embodiments of the present disclosure.
Figure 2B:
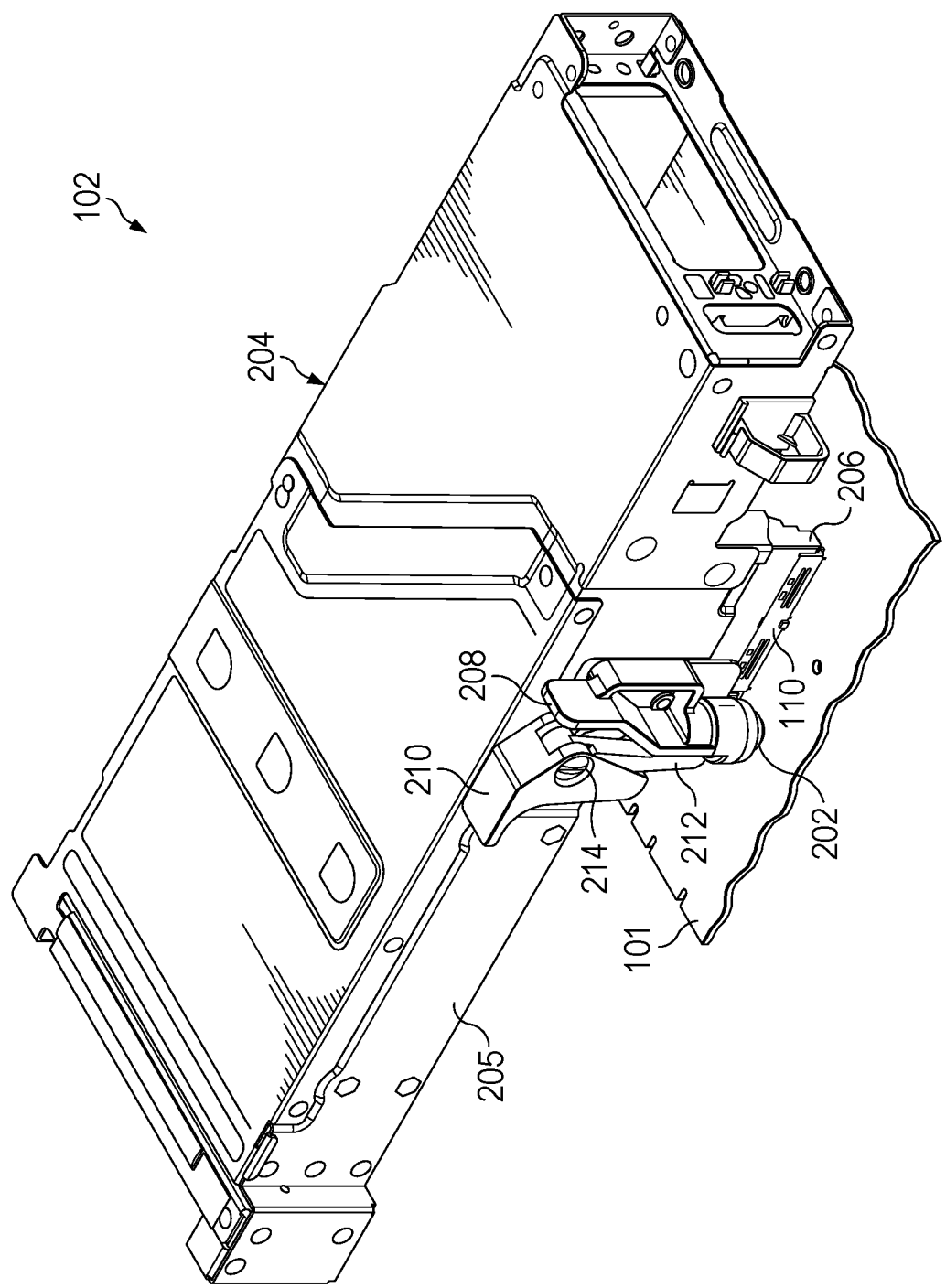

FIGS. 2A and 2B illustrate a perspective view of selected components of information handling system 102, in accordance with embodiments of the present disclosure. As shown in FIGS. 2A and 2B, motherboard 101 may include a post 202 mounted on motherboard 101, post 202 having a ledge 216 at the end of post 202 opposite motherboard 101. As further depicted in FIGS. 2A and 2B, information handling system 102 may include a riser assembly 204 configured to house riser card 106 (not explicitly shown in FIGS. 2A and 2B), a connector 206 of riser card 106, and any expansion cards coupled to riser card 106 (also not explicitly shown in FIGS. 2A and 2B). Riser assembly 204 may have mechanically coupled thereto a latch assembly comprising a support 208 fixedly coupled to a housing 205 of riser assembly 204, a handle 210 rotatably coupled to support 208 and/or housing 205 via an axis 214, wherein axis 214 may be implemented by an axle, screw, bearing, or other suitable component that defines an axis of rotation of handle 210 relative to support 208 and/or housing 205. The latch assembly may also include a catch arm 212 rotatably coupled to handle 210 via an axis not explicitly shown in FIGS. 2A and 2B, but which is described in greater detail below.

Figure 3:
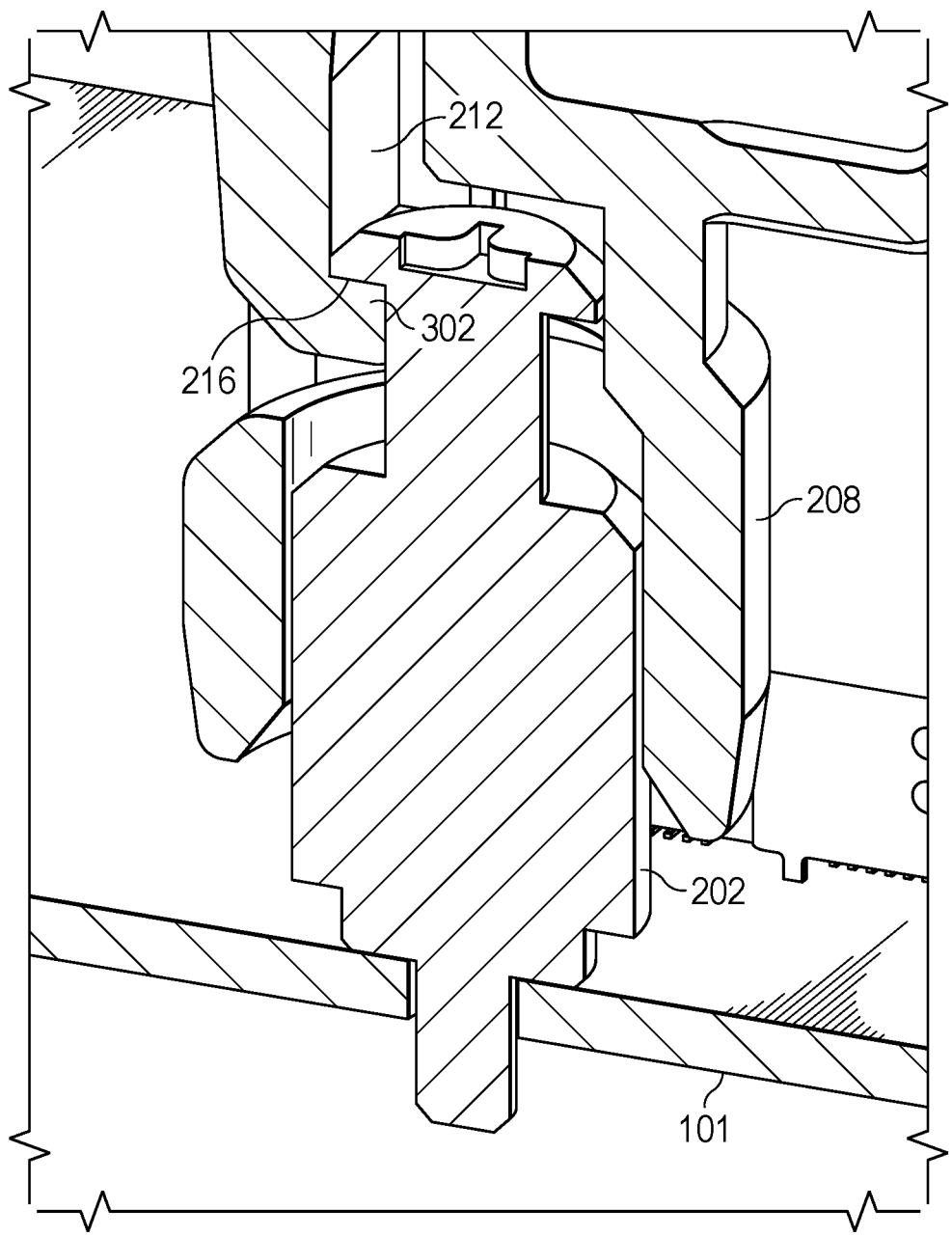
FIG. 3 illustrates a magnified cross-sectional perspective view of selected components of the example information handling system of FIG. 1, in accordance with embodiments of the present disclosure.

To mechanically and electrically couple connector 206 to connector 110, riser assembly 204 may be lowered onto motherboard 101 in a manner such that connector 206 and connector 110 align and such that a guide feature 218 (e.g., a round opening) of support 208 aligns with post 202 in order to minimize movement of riser assembly 204 in directions parallel to the surface of motherboard 101. Once riser assembly 204 is lowered onto motherboard 101 such that connector 206 and connector 110 at least partially engage with one another and such that guide feature 218 and post 202 at least partially engage with one another, handle 210 may be rotated relative to support 208 from an unlatched position as shown in FIG. 2A to a latched position as shown in FIG. 2B, with certain components depicted in the latched position in the magnified cross-sectional perspective view of FIG. 3. As handle 210 is rotated relative to support 208 from the unlatched position to an intermediate position between the unlatched position and the latched position, catch arm 212 may also rotate in an arc from a first position in which it is disengaged from post 202 to a second position in which a retention feature 302 (see FIG. 3) of catch arm 212 positions itself under and proximate to ledge 216 of post 202. Finally, as handle 210 is rotated from the intermediate position to the latched position, catch arm 212 and its retention feature 302 may move "upward" in a direction perpendicular to the surface of motherboard 101, to a third position to secure retention feature 302 of catch arm 212 to ledge 216 as shown in FIG. 3, thus providing mechanical force to mechanically overdrive connector 206 and connector 110 relative to one another, to ensure full mating between connector 206 and connector 110. Such mechanical overdrive may ensure no gap is left between catch arm 212 and the underside of ledge 216 when handle 210 is in its latched position. Components of the latch assembly may be arranged such that the mechanical overdrive is absorbed by mechanical deflection of the latch assembly, allowing tolerances to be absorbed by the latch assembly and not by connector 206 and connector 110.

To decouple connector 206 from connector 110, handle 210 may be translated from the latched position to the unlatched position, such that retention feature 302 of catch arm 212 is disengaged from ledge 216, from the third position to the second position, then to the first position.

Figure 4:
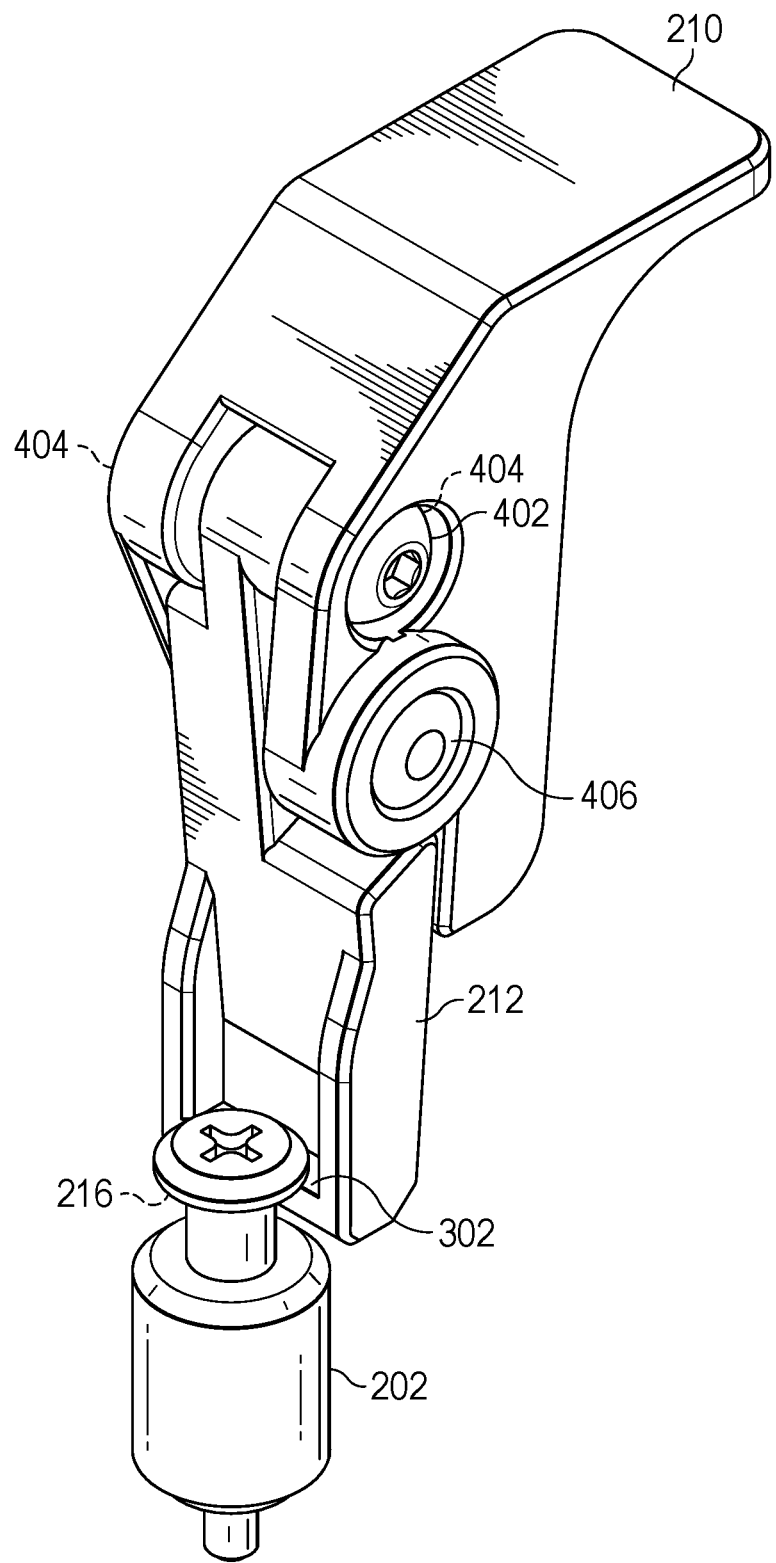
FIG. 4 illustrates a perspective view of selected components of a latch assembly, in accordance with embodiments of the present disclosure.

FIG. 4 illustrates a perspective view of selected components of the latch assembly depicted in FIGS. 2A and 2B, in accordance with embodiments of the present disclosure. In particular, FIG. 4 depicts handle 210 having one or more openings 404 by which catch arm 212 may rotatably couple to handle 210 via an axis 402, wherein axis 402 may be implemented by an axle, screw, bearing, or other suitable component that defines an axis of rotation of catch arm 212 relative to handle 210. FIG. 4 also depicts handle 210 having one or more openings 406 via which handle 210 may receive axis 214 in order to rotatably couple handle 210 to housing 205 and/or support 208. For purposes of clarity and exposition, support 208 is not depicted in FIG. 4.

Figure 5A:
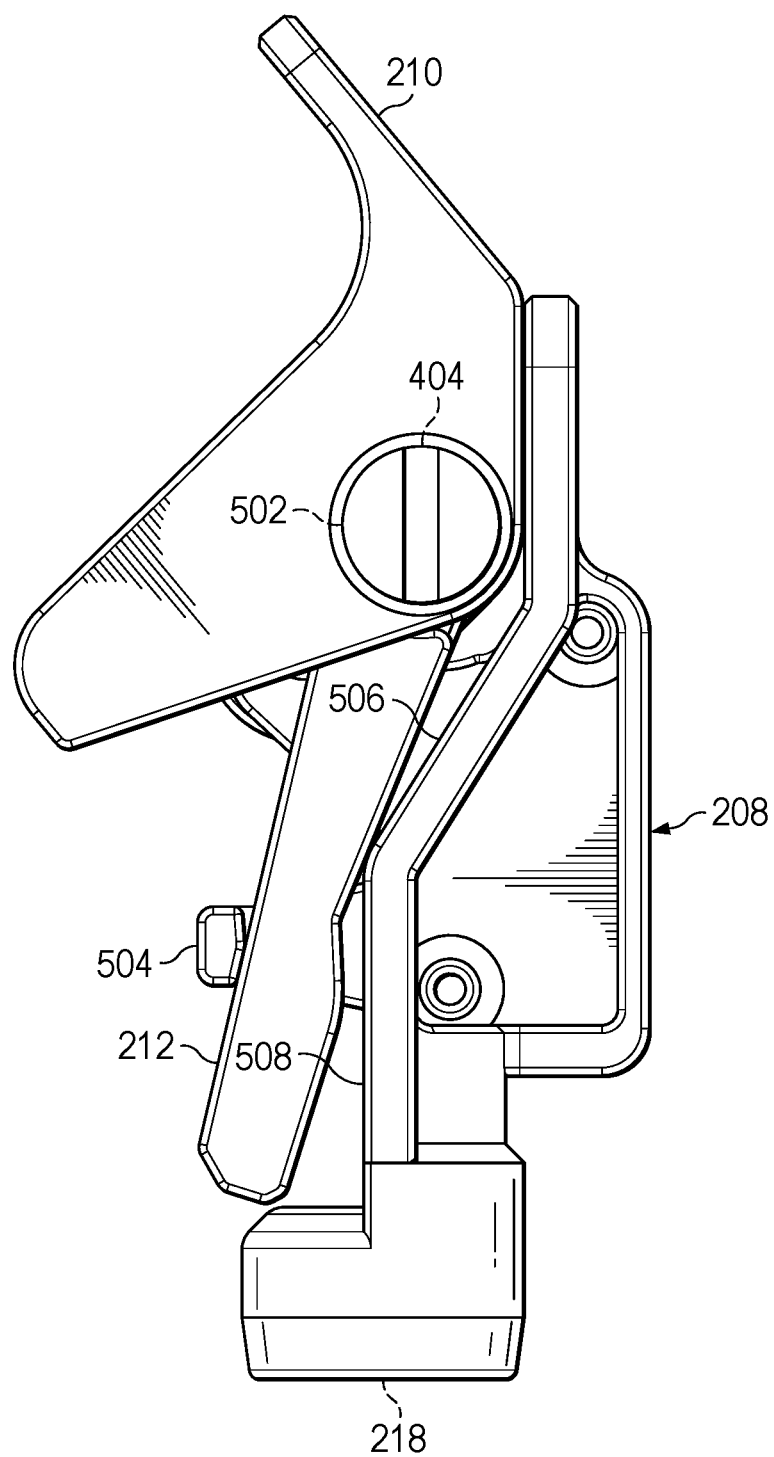
FIGS. 5A and 5B illustrate a side elevation view of selected components of the latch assembly of FIG. 4, in accordance with embodiments of the present disclosure.
Figure 5B:
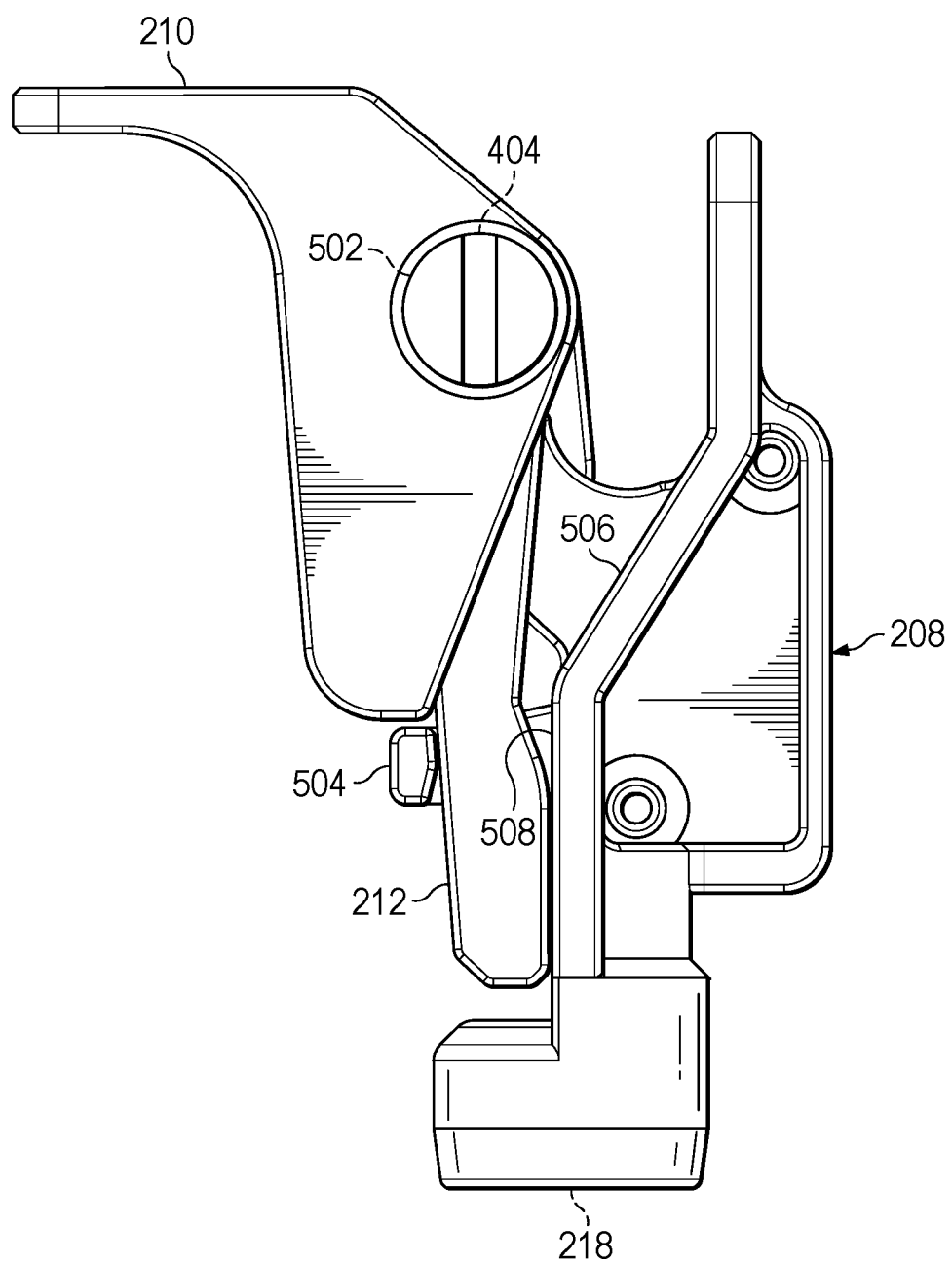

FIGS. 5A and 5B illustrate a side elevation view of selected components of the latch assembly, in accordance with embodiments of the present disclosure. As shown in FIGS. 5A and 5B, catch arm 212 may include one or more openings 502 by which catch arm 212 may rotatably couple to handle 210 via an axis 402 (not explicitly shown in FIGS. 5A and 5B), to allow catch arm 212 to translate from the first position as shown in FIG. 5A, through the second position (not explicitly shown in FIGS. 5A and 5B), and to the third position as shown in FIG. 5B. As further shown in FIGS. 5A and 5B, support 208 may include mechanical features to aid and/or constrain motion of catch arm 212. For example, as catch arm 212 translates from the second position to the third position, an arm 504 extending from a body of support 208 and guide portion 508 of support 208 having a surface generally perpendicular to the surface of motherboard 101 may guide catch arm 212 in a generally upward position perpendicular to the surface of motherboard 101. As another example, as catch arm 212 translates from the second position to the first position, guide portion 508 and a slanted guide portion 506 having an acute angle with guide portion 508 may form a "knee" between them causing catch arm 212 to travel in an arc in order that retention feature 302 of catch arm 212 disengages from ledge 216. For purposes of clarity and exposition, opening (s) 406 is/are not depicted in FIGS. 5A and 5B.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system comprising:
   a circuit board having a receptacle connector mounted to a surface of the circuit board and having a post mounted to the surface of the circuit board; and
   an information handling resource assembly comprising:
      a housing for carrying an information handling resource having an edge connector configured to mechanically and electrically couple to the receptacle connector; and
      a latch assembly comprising:
         a support fixedly coupled to the housing;
         a handle rotatably coupled to one of the support and the housing via a first axis and rotatable between an unlatched position and a latched position relative to the support; and
         a catch arm rotatably coupled to the handle via a second axis and arranged such that:
            as the handle is rotated from the unlatched position to an intermediate position between the unlatched position and the latched position, the catch arm is translated in an arc from a first position in which it is disengaged from the post to a second position in which a retention feature of the catch arm positions itself under and proximate to a ledge of the post; and
            as the handle is rotated from the intermediate position to the latched position, the catch arm and the retention feature move in a direction away from and perpendicular to the surface of the motherboard to a third position in order to secure the retention feature to the ledge and drive a mechanical force to mate the receptacle connector and the edge connector.

2. The information handling system of claim 1, wherein the information handling resource comprises a riser card.

3. The information handling system of claim 1, wherein the circuit board comprises a motherboard.

4. The information handling system of claim 1, wherein the support comprises guiding features to guide the catch arm in the direction away from and perpendicular to the surface of the motherboard to the third position.

5. The information handling system of claim 1, wherein the catch arm is arranged such that as the handle is rotated from the latched position to the unlatched position, the catch arm translates from the third position to the second position to the first position in order to disengage the retention feature from the post.

6. The information handling system of claim 5, wherein the support comprises guiding features to guide the catch arm in the arc from the third position to the second position.

7. A latch assembly comprising:
   a support configured to fixedly couple to a housing of an information handling resource;
   a handle configured to rotatably couple to one of the support and the housing via a first axis and rotatable between an unlatched position and a latched position relative to the support; and a catch arm rotatably coupled to the handle via a second axis and arranged such that:

as the handle is rotated from the unlatched position to an intermediate position between the unlatched position and the latched position, the catch arm is translated in an arc from a first position in which it is disengaged from a post to a second position in which a retention feature of the catch arm positions itself under and proximate to a ledge of the post; and as the handle is rotated from the intermediate position to the latched position, the catch arm and the retention feature move in a linear direction from the second position to a third position.

8. The latch assembly of claim 7, wherein the support comprises guiding features to guide the catch arm in the linear direction from the second position to the third position.

9. The latch assembly of claim 7, wherein the catch arm is arranged such that as the handle is rotated from the latched position to the unlatched position, the catch arm translates from the third position to the second position to the first position.

10. The latch assembly of claim 9, wherein the support comprises guiding features to guide the catch arm in the arc from the third position to the second position.

11. A method comprising:

fixedly coupling a support of a latch assembly to a housing of an information handling resource;

rotatably coupling a handle to one of the support and the housing via a first axis, rotatable between an unlatched position and a latched position relative to the support; and rotatably coupling a catch arm to the handle via a second axis and arranging the catch arm such that:

as the handle is rotated from the unlatched position to an intermediate position between the unlatched position and the latched position, the catch arm is translated in an arc from a first position in which it is disengaged from a post to a second position in which a retention feature of the catch arm positions itself under and proximate to a ledge of the post; and as the handle is rotated from the intermediate position to the latched position, the catch arm and the retention feature move in a linear direction from the second position to a third position.

12. The method of claim 11, wherein the support comprises guiding features to guide the catch arm in the linear direction from the second position to the third position.

13. The method of claim 11, further comprising arranging the catch arm such that as the handle is rotated from the latched position to the unlatched position, the catch arm translates from the third position to the second position to the first position.

14. The method of claim 13, wherein the support comprises guiding features to guide the catch arm in the arc from the third position to the second position.

\* \* \* \* \*